United States Patent [19]

D'Souza

[11] Patent Number: 5,557,581
[45] Date of Patent: Sep. 17, 1996

[54] LOGIC AND MEMORY CIRCUIT WITH REDUCED INPUT-TO-OUTPUT SIGNAL PROPAGATION DELAY

[75] Inventor: Godfrey P. D'Souza, Santa Clara, Calif.

[73] Assignee: Sun Microsystems, Inc., Mountain View, Calif.

[21] Appl. No.: 419,377

[22] Filed: Apr. 10, 1995

[51] Int. Cl.$^6$ .................................................. G11C 7/00
[52] U.S. Cl. ................... 365/233; 365/189.05; 365/194; 365/191
[58] Field of Search .............................. 365/189.05, 194, 365/191, 233, 94

[56] References Cited

U.S. PATENT DOCUMENTS

| | | | |
|---|---|---|---|
| 5,134,518 | 7/1992 | Ishibashi et al. | 365/189.05 |
| 5,377,149 | 12/1994 | Gultier | 365/189.05 |
| 5,377,158 | 12/1994 | Nishizawa | 365/189.05 |
| 5,384,735 | 1/1995 | Park et al. | 365/189.05 |

OTHER PUBLICATIONS

Daniel W. Dobberpuhl, Richard T. Witek, Randy Allmon, Robert Anglin, David Bertucci, Sharon Britton, Linda Chao, Robert A. Conrad, Daniel E. Dever, Bruce Gieseke, Soha M. N. Hassoun, Gregory W. Hoeppner, Kathryn Kuchler, Maureen Ladd, Burton M. Leary, Liam Madden, Edward J. McLellan, Derrick R. Meyer, James Montanaro, Donald A. Priore, Vidya Rajagopalan, Sridhar Samudrala and Sribalan Santanam, "A 200–MHz 64–b Dual–Issue CMOS Microprocessor", IEEE Journal of Solid–State Circuits, vol. 27, No. 11, Nov. 1992, pp. 1555–1567.

Patrik Larsson and Christer Svensson, "Noise in Digital Dynamic CMOS Circuits", IEEE Journal of Solid–State Circuits, vol. 29, No. 6, Jun. 1994, pp. 655–662.

Jiren Yuan and Christer Svensson, "High–Speed CMOS Circuit Technique", IEEE Journal of Solid–State Circuits, vol. 24, No. 1, Feb. 1989, p. 62.

Ingemar Karlsson, "True Single Phase Clock Dynamic CMOS Circuit Technique", 1988 IEEE, pp. 475–478.

Yuan Ji–Ren, Ingemar Karlsson and Christer Svensson, "A True Single–Phase–Clock Dynamic CMOS Circuit Technique", IEEE Journal of Solid–State Circuits vol. SC–22, No. 5, Oct. 1987, pp. 899–901.

Primary Examiner—David C. Nelms
Assistant Examiner—Vu A. Le
Attorney, Agent, or Firm—Limbach & Limbach L.L.P.

[57] ABSTRACT

A logic and memory circuit with reduced input-to-output signal propagation delay includes signal processor and memory elements connected in parallel for performing "memory work" simultaneously with "logical work" and/or "electrical work." Incorporated within a flip-flop having master and slave latches which perform the memory work (i.e. data storage) on the input and output logic signals, respectively, is a signal processor which processes one or more input signals to provide an output signal. Where memory work and electrical work are to be performed simultaneously, the signal processor includes a serial group of circuits having successively larger transistors for buffering an input signal to provide the output signal simultaneously with the storage of the input and output signals by the master and slave latches, respectively. Where memory work and logical work are to be performed simultaneously, the signal processor includes a logic function circuit (e.g. a logic gate) for logically processing one or more input signals to provide the output signal simultaneously with the storage of the input and output signals by the master and slave latches, respectively.

27 Claims, 3 Drawing Sheets

LOGIC AND MEMORY CIRCUIT WITH REDUCED INPUT-TO-OUTPUT SIGNAL PROPAGATION DELAY

BACKGROUND OF THE INVENTION

1. Field of the Invention

The present invention relates to logic circuits, and in particular, to logic circuits in which two or more signal processing functions are performed in parallel, i.e. simultaneously, so as to minimize input-to-output signal propagation delay.

2. Description of the Related Art

In the unending quest for increased performance and operating speed, digital logic designers are constantly analyzing and seeking to optimize the performance characteristics of the circuits used for processing digital logic signals. These circuit performance characteristics, or functions, can be broadly classified as performing "logical work," "electrical work," "communication work," "synchronization work" and "memory work."

Logical work includes those functions by which digital logic signals are logically manipulated or processed, with common examples including multiplexors and Boolean logic gates such as AND, OR, NAND, NOR, etc. Electrical work includes those functions whereby the electrical parameters of the digital logic signals are manipulated or processed, with one common example including signal buffering whereby the load-driving capability of a signal is increased. Communication work includes those functions whereby the various digital logic signals are communicated to their appropriate destinations, with common examples including conductors. Synchronization work includes those functions whereby relative timing between signals is established so that the various logic signals are received and outputted at the desired times, with common examples including work performed by synchronized latches, transmission gates and pass gates. Memory work includes those functions whereby data is stored for later use, with common examples including latches and random access memory (RAM).

Of the foregoing, that which is generally most critical is the logical work, with the remaining circuit functions generally seen as serving as support functions. However, regardless of the relative importance of each of these functions, designers and users have nonetheless sought to increase the performance and speed of each one. However, just as with any function which must be performed by physical processes or elements, physical limits are soon encountered which establish upper limits on performance and operating speed.

Accordingly, it would be desirable to have a technique whereby performance and speed of a logic circuit can be increased irrespective of the physical limits then predominating among the various circuit functions.

SUMMARY OF THE INVENTION

In accordance with the present invention, one or more input logic signals can be processed and stored and a corresponding output logic signal provided and stored with reduced input-to-output signal propagation delay. Basic logic functions are designed to be accomplished with memory work (i.e. input and output logic data storage) done simultaneously, e.g. in parallel, with electrical work (e.g. input signal buffering for driving a load) and/or logical work (e.g. Boolean logic processing) so as to minimize the time needed for fully processing the input signal(s) and providing the output signal.

An apparatus with a logic and memory circuit with reduced input-to-output signal propagation delay in accordance with one embodiment of the present invention includes: a synchronizer stage for receiving one or more input logic signals and providing one or more synchronous logic signals corresponding thereto; a logic stage, coupled to said synchronizer stage, for receiving and processing said one or more synchronous logic signals and providing an output logic signal in response thereto; and a storage element, coupled to said logic stage, for receiving and holding said one or more synchronous logic signals. In various embodiments of the present invention, the logic and memory circuit includes, individually or in combination, a logic stage with a number of processing circuits having successively larger transistors or a logic gate for processing the one or more input logic signals to provide the output logic signal, and a storage element with one or more latches for storing the one or more input logic signals simultaneously with the processing thereof by the logic stage.

These and other features and advantages of the present invention will be understood upon consideration of the following detailed description of the invention and the accompanying drawings.

DETAILED DESCRIPTION OF THE INVENTION

Figure 1:
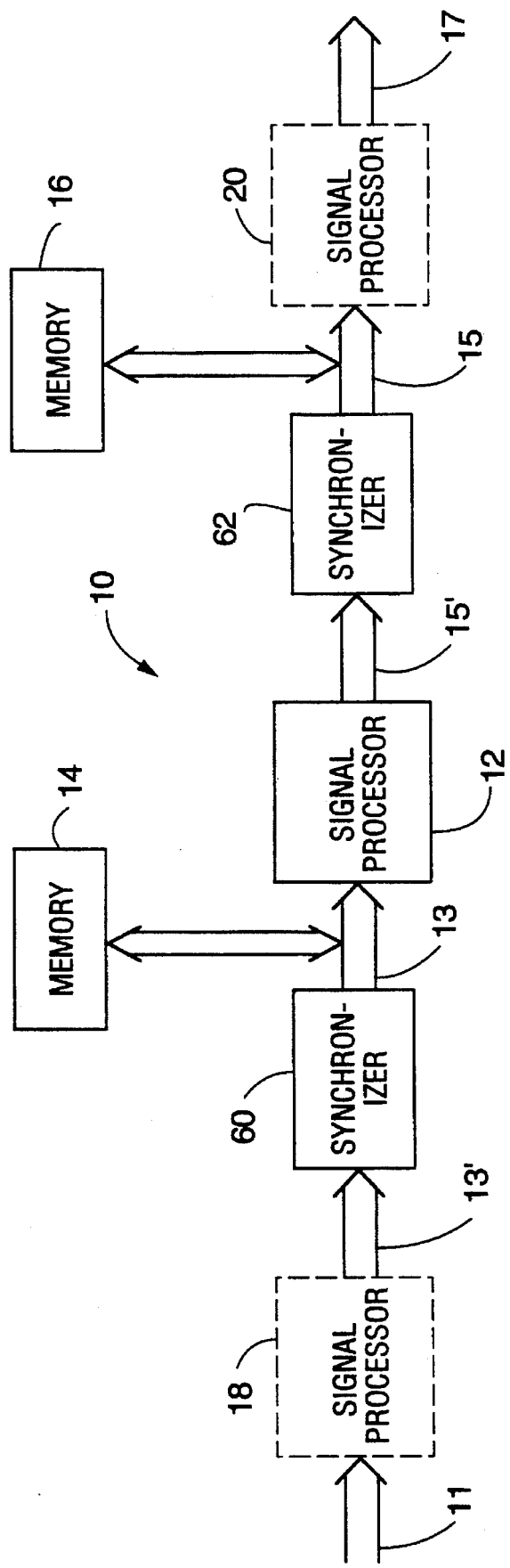
FIG. 1 is a functional block diagram of a logic and memory circuit with reduced input-to-output signal propagation delay in accordance with the present invention.

Referring to FIG. 1, a logic and memory circuit 10 with reduced input-to-output signal propagation delay in accordance with the present invention includes a signal processor 12, synchronizer elements 60, 62 and memory elements 14, 16. Additional signal processor elements 18, 20 can also be included to provide a larger, overall signal processing functionality.

One or more input logic signals 13 are received by the signal processor 12 in a synchronized manner via the input synchronizer element 60 for logical processing to provide one or more output signals 15 in a synchronized manner via the output synchronizer element 62. Simultaneously with the receiving and processing of the synchronized input signals 13, the input signals 13 are also received and stored within the input memory element 14. Similarly, simultaneously with the providing of the synchronized output signals 15, the output signals 15 are received and stored by the output memory element 16. (Where such signal processors 18, 20 are included, the input signals 13' to the input synchronizer element 60 are provided by first processing incoming signals 11 with the input signal processor 18, while the synchronized output signals 15 are further processed by the output signal processor 20 to produce outgoing signals 17.)

Figure 2:
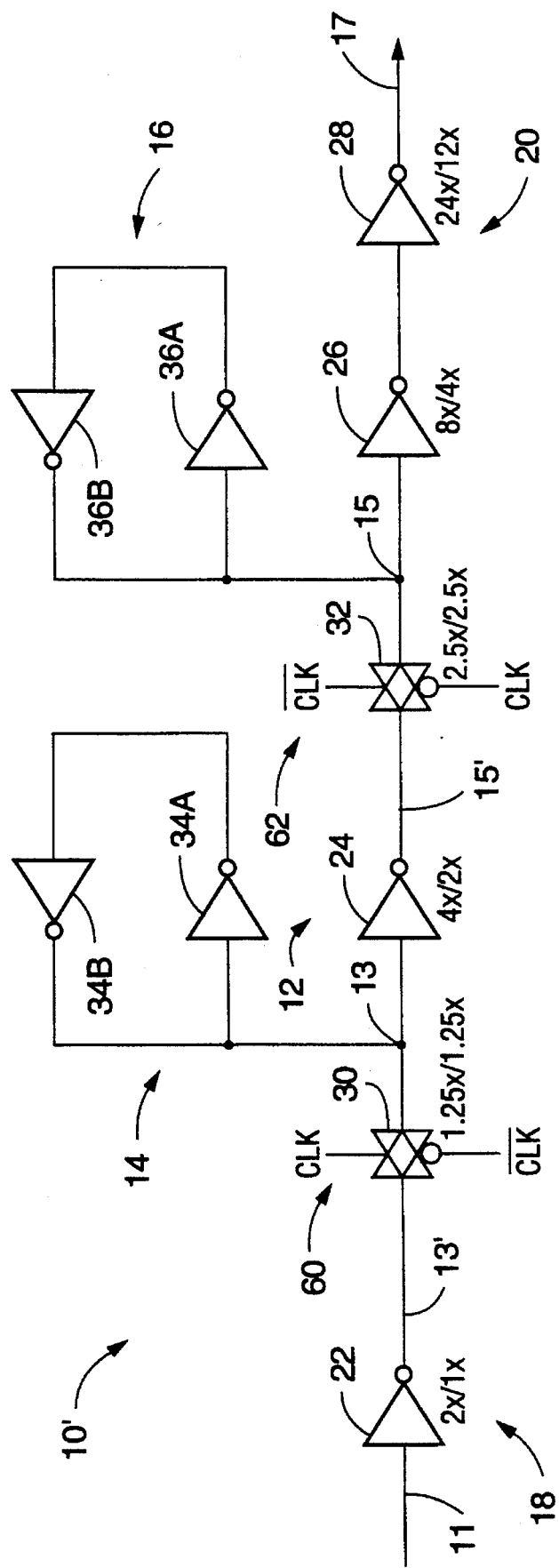
FIG. 2 is a logic diagram of a logic and memory circuit in accordance with one embodiment of the present invention.

Referring to FIG. 2, one embodiment of the circuit 10 of FIG. 1 can be realized as a synchronous buffer circuit 10' (e.g. a flip-flop). This buffer circuit 10' includes a serial connection of logic inverters 22, 24, 26, 28 and transmission gates 30, 32, connected as shown. An input signal 11 is inverted by the first inverter 22 and synchronously passed to and inverted by the successive inverters 24, 26, 28 via the transmission gates 30, 32 which are clocked by the mutually inverse phases of a clock signal CLK, $\overline{\text{CLK}}$. The input 13 to the second inverter 24 is latched by an asynchronous latch formed by cross coupled inverters 34a, 34b simultaneously, i.e. in parallel, with processing by the second inverter 24. Similarly, the output 15 of the second transmission gate 32 is latched by an asynchronous latch formed by cross coupled inverters 36a, 36b.

In this buffer circuit 10', electrical work is performed by buffering input signals 11 to produce output signals 17 having higher load-driving capability. This is accomplished by appropriately sizing, or scaling, the transistors forming the serial inverters 22, 24, 26, 28 and transmission gates 30, 32. For example, as represented in FIG. 2, the upper and lower MOSFETs (i.e. the P-MOSFET pull-up and N-MOSFET pull-down transistors, respectively) forming the first inverter have relative device sizes of 2X and 1X, respectively (where X represents the design-specific sizing, or scaling, unit). Each of the remaining inverters 24, 26, 28 has successively larger corresponding transistor dimensions, with the upper devices having relative sizes of 4X, 8X and 24X and the lower devices having relative sizes of 2X, 4X and 12X, respectively. Similarly, both the upper and lower device dimensions of the transmission gates 30, 32 are successively larger, i.e. increasing from 1.25X to 2.5X. By scaling these inverters 22, 24, 26, 28 and transmission gates 30, 32 in this manner, the electrical work performed by this circuit 10' does not become reset at each clock cycle boundary, i.e. at the transmission gates 30, 32. Hence, the electrical work performed by this circuit 10' is distributed for performance thereof irrespective of clock cycle boundaries.

As noted above, the two intermediate signals 13, 15 outputted by the transmission gates 30, 32 are latched by asynchronous latches 34a/34b, 36a/36b. This allows the memory work performed by these latches 34a/34b, 36a/36b to be performed simultaneously, or in parallel, with the aforementioned electrical work performed by the serially connected inverters 22, 24, 26, 28 and transmission gates 30, 32. Accordingly, the input-to-output signal propagation delay of this circuit 10' is minimized since its memory work functions are performed simultaneously with its electrical work functions.

The correspondence of the various circuit elements in the circuit 10' of FIG. 2 to those in the circuit 10 of FIG. 1 can be considered as follows: the first inverter 22 corresponds to the input signal processor 18; the first transmission gate 30 corresponds to the input synchronizer element 60; the first pair of cross coupled inverters 34a, 34b corresponds to the input memory element 14; the second inverter 24 corresponds to the primary signal processor 12; the second transmission gate 32 corresponds to the output synchronizer element 62; the second pair of cross coupled inverters 36a, 36b corresponds to the output memory element 16; and the last two inverters 26, 28 together correspond to the output signal processor 20.

Figure 3:
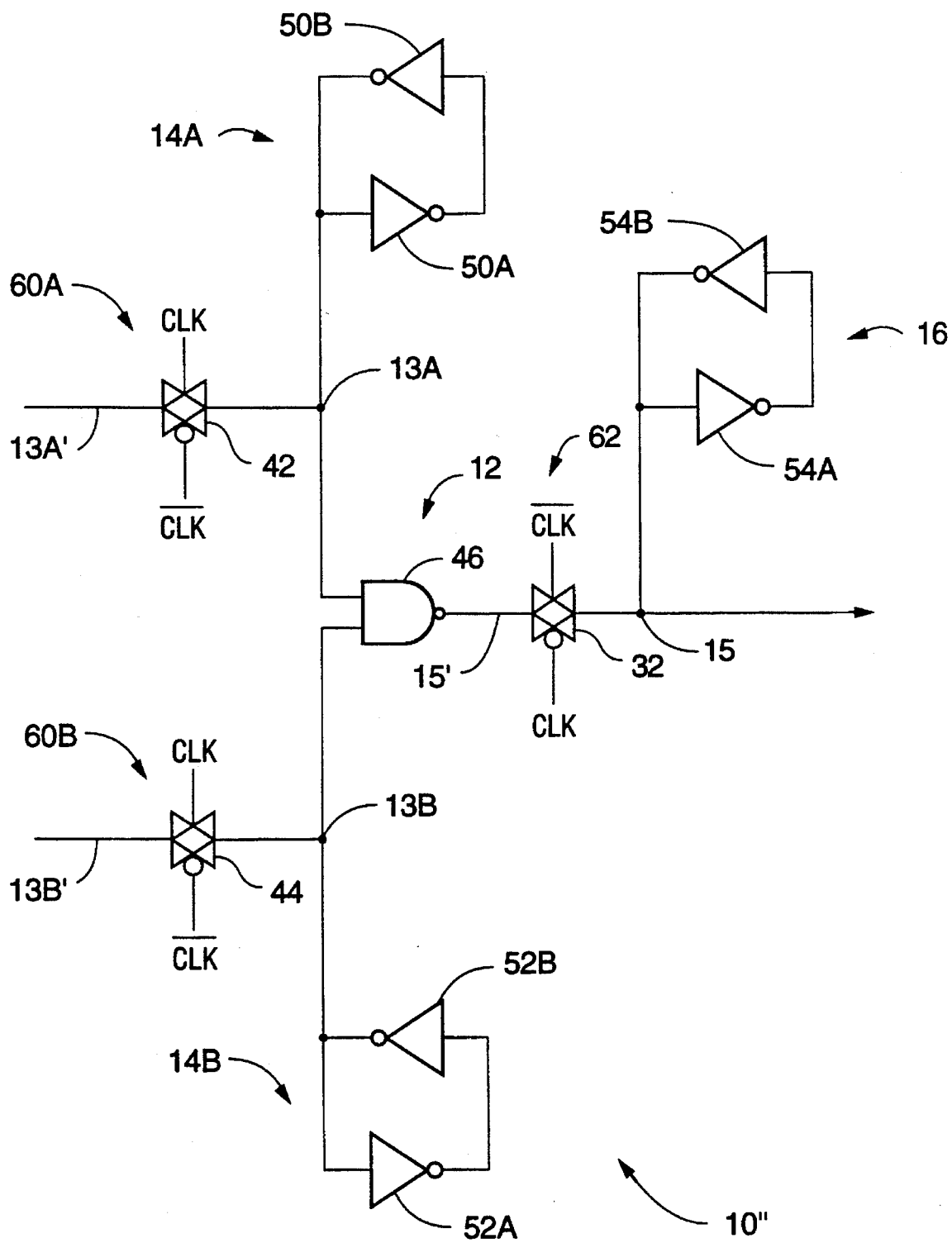
FIG. 3 is a logic diagram of a logic and memory circuit in accordance with another embodiment of the present invention.

Referring to FIG. 3, another embodiment 10" of the circuit 10 of FIG. 1 can be realized with two input transmission gates 42, 44, a NAND gate 46, an output transmission gate 48, cross coupled inverters 50a and 50b, cross coupled inverters 52a and 52b and cross coupled inverters 54a and 54b, connected as shown. (It should be noted that the synchronizing elements can be transmission gates, e.g. two pass gates connected in parallel, as shown in FIGS. 2 and 3 or, alternatively, single pass gates, as desired.) Input signals 13a' and 13b' are clocked in via input transmission gates 42 and 44, respectively, with the resulting signals 13a, 13b serving as inputs to the NAND gate 46 and being latched by the asynchronous latches formed by cross coupled inverters 50a and 50b and cross coupled inverters 52a and 52b, respectively. The NANDed output signal 15' is clocked by the output transmission gate 48 to form the output signal 15 which is latched by the asynchronous latch formed by cross coupled inverters 54a and 54b.

In this circuit 10", the logical work, in this case a NAND function, is performed simultaneously, or in parallel, with the memory work performed by the asynchronous latches formed by the cross coupled inverters 50a/50b, 52a/52b.

The correspondence among the circuit elements in the circuit 10" of FIG. 3 to those in the circuit 10 of FIG. 1 can be considered as follows: the first and second transmission gates 42, 44 correspond to portions 60a, 60b of the input synchronizer element 60; the first and second pairs of cross coupled inverters 50a, 50b, 52a, 52b correspond to portions 14a, 14b of the input memory element 14; the NAND gate 46 corresponds to the primary signal processor 12; the third transmission gate 48 corresponds to the output synchronizer element 62; and the third pair of cross coupled inverters 54a, 54b corresponds to the output memory element 16.

In accordance with the forgoing discussion, it should be understood that significant reductions in input-to-output signal propagation delays can be realized by integrating a number of logic and memory circuits in accordance with the present invention into an integrated circuit. Moreover, it should be further understood that incorporating a number of such logic and memory circuits into a computer can advantageously result in increased performance and operating speed.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a logic and memory circuit with reduced input-to-input signal propagation delay, said logic and memory circuit comprising:

a synchronizer stage for receiving one or more input logic signals and providing one or more synchronous logic signals corresponding thereto;

a logic stage, coupled to said synchronizer stage, for receiving and asynchronously processing said one or more synchronous logic signals and providing an asnychronous output logic signal in response thereto; and a storage element, coupled to said logic stage, for receiving a and holding said one or more synchronous logic signals simultaneously with said asynchronous processing thereof by said logic stage.

2. The apparatus of claim 1, wherein said logic and synchronizer stages together define a data signal path.

3. The apparatus of claim 2, wherein said storage element is outside of said data signal path.

4. The apparatus of claim 1, wherein said logic stage comprises a logic gate.

5. The apparatus of claim 1, wherein said synchronizer stage comprises one or more pass gates.

6. The apparatus of claim 1, wherein said storage element comprises one or more latches.

7. The apparatus of claim 1, further comprising an integrated circuit into which said logic and memory circuit is integrated.

8. The apparatus of claim 1, further comprising a computer into which said logic and memory circuit is incorporated.

9. A method of providing an apparatus including a logic and memory circuit with reduced input-to-output signal propagation delay said method comprising the steps of:

provoding a synchronizer stage for receiving one or more input logic signals and providing one or more synchronous logic signals corresponding thereto;

providing a logic stage, coupled to said synchronizer stage, for receiving and asynchronously processing said one or more synchronous logic signals and providing an asynchronous output logic signal in response thereto; and providing a storage element, coupled to said logic stage, for receiving and holding said one or more synchronous logic signals simultaneously with said asynchronous processing thereof by said logic stage.

10. The method of claim 9, wherein said steps of providing a logic stage and providing a synchronizer stage together comprise a step of defining a data signal path.

11. The method of claim 10, wherein said step of providing a storage element comprises providing a storage element which is outside of said data signal path.

12. The method of claim 9 wherein said step of providing a logic stage comprises providing a logic gate.

13. The method of claim 9, wherein said step of providing a synchronizer stage comprises providing one or more pass gates.

14. The method of claim 9, wherein said step of providing a storage element comprises providing one or more latches.

15. The method of claim 9, further comprising the step of providing an integrated circuit in which said logic and memory circuit is integrated.

16. The method of claim 9, further comprising the step of providing a computer in which said logic and memory circuit is incorporated.

17. A method of receiving, storing and processing one or more input logic signals and providing an output logic signal with reduced input-to-output signal propagation delay, said method comprising the steps of:

receiving one or more input logic signals and providing one or more synchronous logic signals with a synchronizer stage; and asynchronously processing said one or more synchronous logic signals with a logic stage and providing an asynchronous output logic signal in response thereto; and receiving and holding said one or more synchronous logic signals with a storage element simultaneously with said asynchronous processing thereof.

18. The method of claim 17, wherein said steps of receiving one or more input logic signals and providing one or more synchronous logic signals with a synchronizer stage and processing said one or more synchronous logic signals with a logic stage and providing an output logic signal in response thereto together comprise defining a data signal path.

19. The method of claim 18, wherein said step of receiving and holding said one or more synchronous logic signals with a storage element simultaneously with said asynchronous processing thereof comprises receiving and holding said one or more synchronous logic signals outside of said data signal path.

20. The method of claim 17, wherein said step of processing said one or more synchronous logic signals with a logic stage and providing an output logic signal in response thereto comprises processing said one or more synchronous logic signals with a logic gate.

21. The method of claim 17, wherein said step of receiving one or more input logic signals and providing one or more synchronous logic signals with a synchronizer stage comprises receiving one or more input logic signals and providing one or more synchronous logic signals with one or more pass gates.

22. The method of claim 17, wherein said step of receiving and holding said one or more synchronous logic signals with a storage element simultaneously with said asynchronous processing thereof comprises receiving and holding said one or more synchronous logic signals with one or more latches.

23. The method of claim 17, further comprising the step of performing the recited steps within an integrated circuit.

24. The method of claim 17, further comprising the step of performing the recited steps within a computer.

25. An apparatus-including a logic and memory circuit with reduced input-to-output signal propagation delay, said logic and memory circuit comprising:

a synchronizer stage for receiving one or more input logic signals and providing one or more synchronous logic signals corresponding thereto;

a logic stage, coupled to said synchronizer stage, for receiving and processing said one or more synchronous logic signals and providing an output logic signal in response thereto, wherein said logic stage comprises a plurality of transistors for receiving and processing said one or more synchronous logic signals and in accordance therewith providing said output logic signal, and wherein following an initial one of said plurality of transistors subsequent ones thereof are successively larger than preceding ones thereof; and a storage element, coupled to said logic stage, for receiving and holding said one or more synchronous logic signals.

26. A method of providing an apparatus including a logic and memory circuit with reduced input-to-output signal propagation delay, said method comprising the steps of:

providing a synchronizer stage for receiving one or more input logic signals and providing one or more synchronous logic signals corresponding thereto;

providing a logic stage, coupled to said synchronizer stage, for receiving and processing said one or more synchronous logic signals and providing an output logic signal in response thereto, wherein said step of providing a logic stage comprises providing a plurality of transistors for receiving and processing said one or more synchronous logic signals and in accordance therewith providing said output logic signal, and wherein following an initial one of said plurality of transistors subsequent ones thereof are successively larger than preceding ones thereof; and providing a storage element, coupled to said logic stage, for receiving and holding said one or more synchronous logic signals.

27. A method of receiving, storing and processing one or more input logic signals and providing an output logic signal with reduced input-to-output signal propagation delay, said method comprising the steps of:

receiving one or more input logic signals and providing one or more synchronous logic signals with a synchronizer stage; and receiving and holding said one or more synchronous logic signals with a storage element; and processing said one or more synchronous logic signals with a logic stage and providing an output logic signal in response thereto by processing said one or more synchronous logic signals with a plurality of transistors, wherein following an initial one of said plurality of transistors subsequent ones thereof are successively larger than preceding ones thereof.

* * * * *

UNITED STATES PATENT AND TRADEMARK OFFICE
CERTIFICATE OF CORRECTION

PATENT NO.    : 5,557,581
DATED         : September 17, 1996
INVENTOR(S)   : Godfrey P. D'Souza It is certified that error appears in the above-identified patent and that said Letters Patent is hereby corrected as shown below:

Column 4, claim 1,
Line 51, delete "input-to-input" and insert -- input-to-output --;

Column 6, claim 25,
Line 28, delete "apparatus-including" and insert -- apparatus including --;

Signed and Sealed this

Eighteenth Day of December, 2001

Attest:

Attesting Officer

JAMES E. ROGAN
Director of the United States Patent and Trademark Office